United States Patent
Hermes

(10) Patent No.: US 6,188,100 B1
(45) Date of Patent: Feb. 13, 2001

(54) CONCENTRIC CONTAINER FIN CAPACITOR

(75) Inventor: Michael Hermes, Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/136,892

(22) Filed: Aug. 19, 1998

(51) Int. Cl.[7] .......... H01L 29/76; H01L 27/108; H01L 29/94; H01L 31/119; H01L 31/062
(52) U.S. Cl. .......... 257/309; 257/308; 257/310; 257/295; 257/296
(58) Field of Search .......... 257/295, 306, 257/308, 309, 310, 296

(56) References Cited

U.S. PATENT DOCUMENTS

| 5,234,858 | 8/1993 | Fazan et al. . | |
| 5,236,855 | 8/1993 | Dennison et al. . | |
| 5,262,662 | 11/1993 | Gonzalez et al. . | |
| 5,266,513 | 11/1993 | Fazan et al. . | |
| 5,323,038 | 6/1994 | Gonzalez et al. . | |
| 5,371,701 | 12/1994 | Lee et al. . | |
| 5,438,011 | 8/1995 | Blalock et al. . | |
| 5,534,458 | * 7/1996 | Okudaira et al. | 257/306 |
| 5,604,147 | 2/1997 | Fischer et al. . | |
| 5,652,164 | 7/1997 | Dennison et al. . | |
| 5,729,054 | * 3/1998 | Summerfelt et al. | 257/751 |
| 5,892,702 | * 4/1999 | Okamoto et al. | 257/309 |

* cited by examiner

Primary Examiner—Mahshid Saadat
Assistant Examiner—Jesse A. Fenty
(74) Attorney, Agent, or Firm—Dickstein Shapiro Morin & Oshinsky LLP

(57) ABSTRACT

A container capacitor and method having an internal concentric fin. In one embodiment, the finned capacitor is a stacked container capacitor in a dynamic random access memory circuit. The finned container capacitor provides a high storage capacitance without increasing the size of the cell. The capacitor fabrication requires only two depositions, a spacer etch and a wet etch step in addition to conventional container capacitor fabrication steps.

32 Claims, 19 Drawing Sheets

CONCENTRIC CONTAINER FIN CAPACITOR

FIELD OF INVENTION

The invention relates generally to integrated circuits and more particularly to a finned capacitor for use in an integrated circuit.

BACKGROUND OF THE INVENTION

Capacitors are used in a wide variety of semiconductor circuits. Capacitors are of special concern in DRAM (dynamic random access memory) memory circuits; therefore, the invention will be discussed in connection with DRAM memory circuits. However, the invention has broader applicability and is not limited to DRAM memory circuits. It may be used in any other type of memory circuit, such as an SRAM (static random access memory), as well as in any other circuit in which capacitors are used.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in trench capacitors is also possible.

One widely used type of stacked capacitor is known as a container capacitor. Known container capacitors are in the shape of an upstanding tube (cylinder) having an oval or circular cross section. FIG. 1 illustrates a top view of a portion of a DRAM memory circuit from which the upper layers have been removed to reveal container capacitors 14 arranged around a bit line contact 16. Six container capacitors 14 are shown in FIG. 1, each of which has been labeled with separate reference designations A to F. In FIG. 1, the bit line contact 16 is shared by DRAM cells corresponding to container capacitors A and B. The wall of each tube consists of two plates of conductive material such as doped polycrystalline silicon (referred to herein as polysilicon or poly) separated by a dielectric. The bottom end of the tube is closed, with the outer wall in contact with either the drain of the access transistor or a plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

As memory cell density continues to increase, there is needed a capacitor that has an increased effective capacitance per cell. The present invention provides a fabrication process and capacitor structure that achieves high storage capacitance without increasing the size of the capacitor or requiring complex fabrication steps.

SUMMARY OF THE INVENTION

The present invention provides a three-dimensional capacitor cell which maintains high storage capacitance without increasing cell area. The capacitor cell of the present invention includes a container capacitor having a concentrically formed internal fin as shown, for example, in FIG. 2B. The fabrication process is advantageous in its simplicity, requiring only two additional deposition steps, a spacer etch and a wet etch.

DETAILED DESCRIPTION OF THE PREFERRED EMBODIMENTS

An example of a fabrication process for a finned container capacitor according to one embodiment of the present invention is described below. It is to be understood, however, that this process is only one example of many possible processes. For example, the bit line is formed over the capacitor in the following process. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 3:
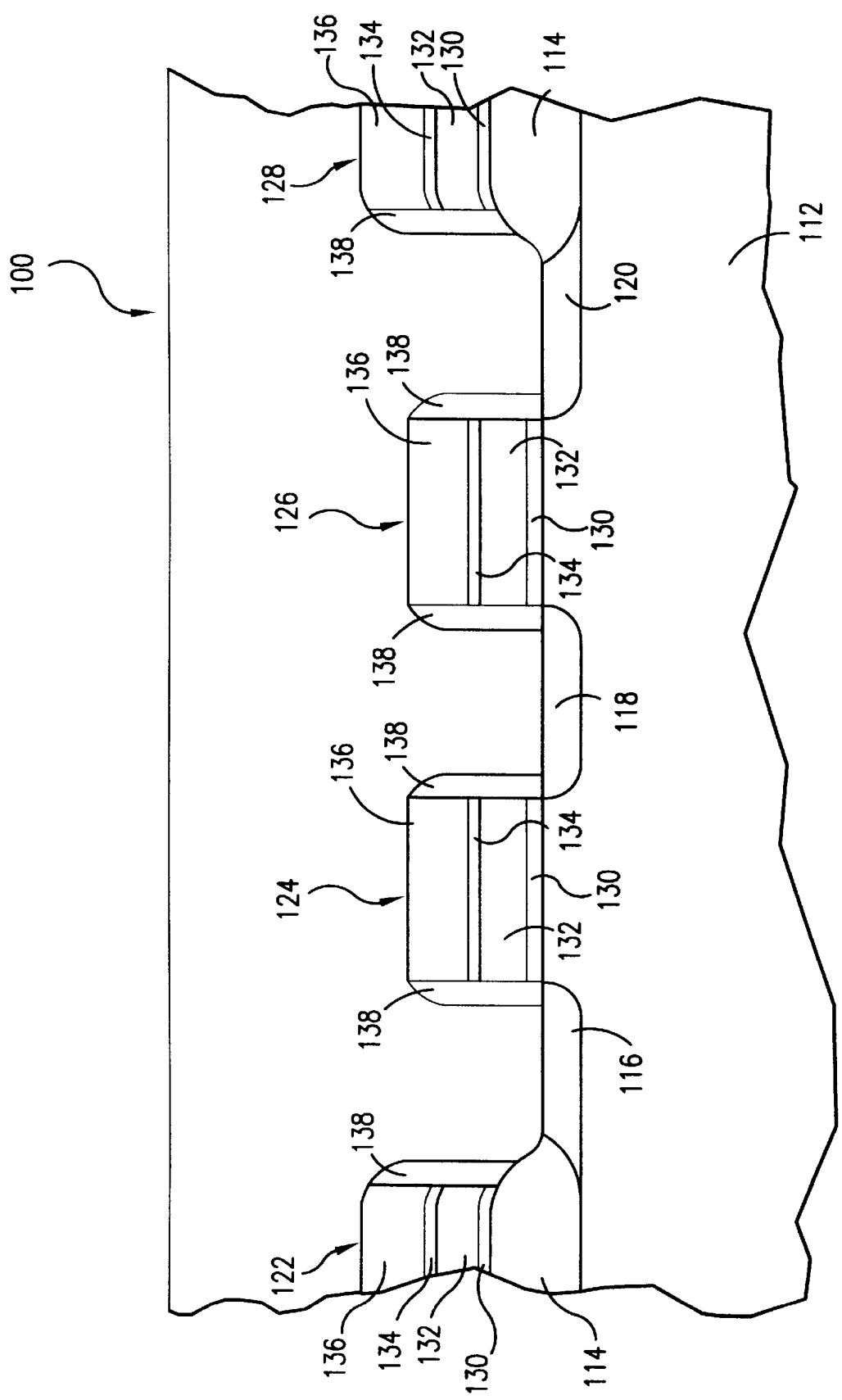
FIG. 3 is a diagrammatic cross-sectional view of a portion of a semiconductor wafer at an early processing step according to one embodiment of the present invention.

Referring now to FIG. 3, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Two FETs are depicted in FIG. 3. One FET is comprised of two active areas (source/drain) 116,118 and one word line (gate) 124. The second FET is comprised of two active areas (source/drain) 118, 120 and a second word line (gate) 126. The active area 118 common to both FETs is the active area over which a bit line contact will be formed. As discussed above, one bit line contact is shared by two DRAM cells to conserve space.

Figure 4:
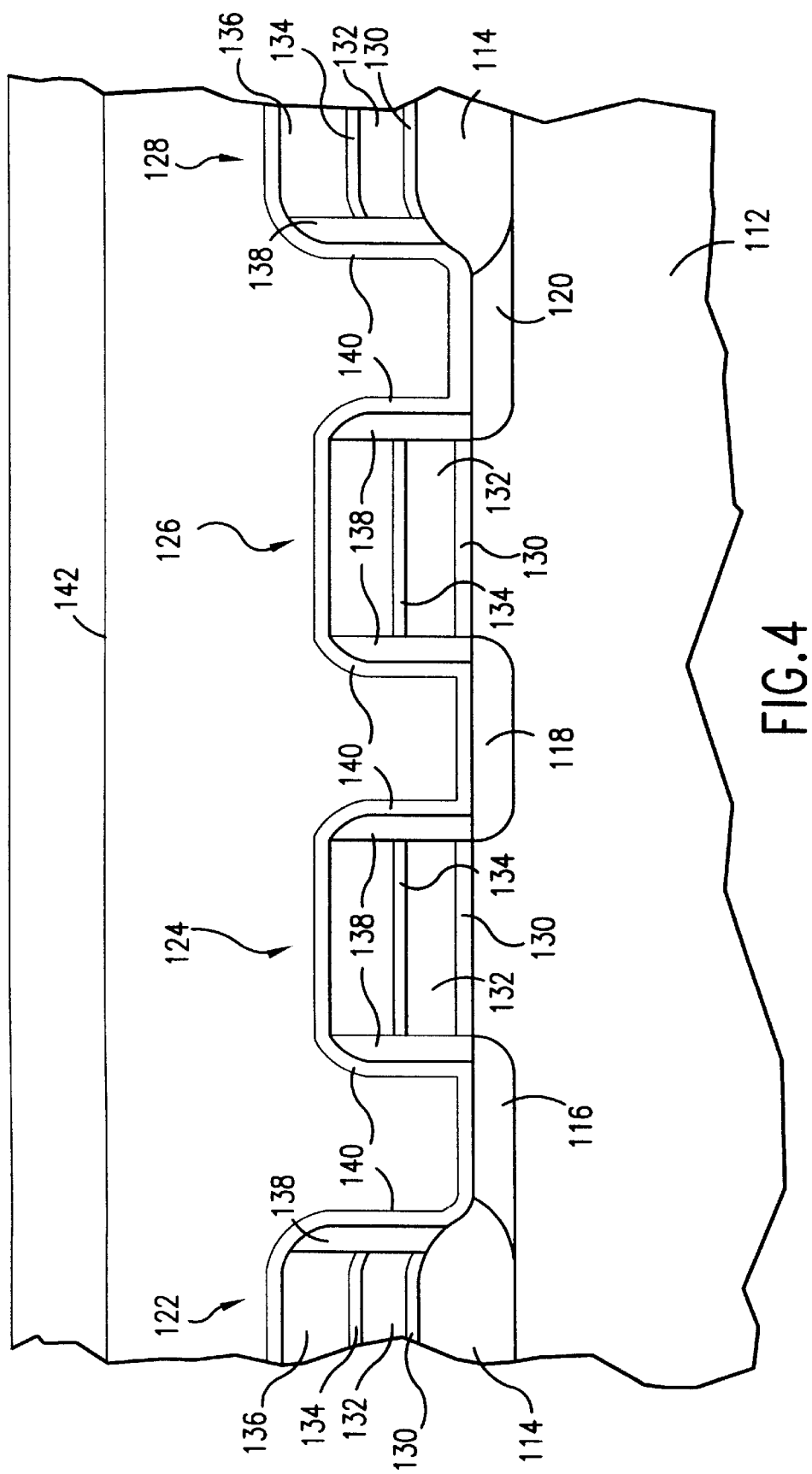
FIG. 4 is a diagrammatic cross-sectional view of a portion of a semiconductor wafer at a processing step subsequent to that shown in FIG. 3.

Referring now to FIG. 4, a thin layer 140 of nitride or TEOS (tetraethyl orthosilicate) is then provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 5:
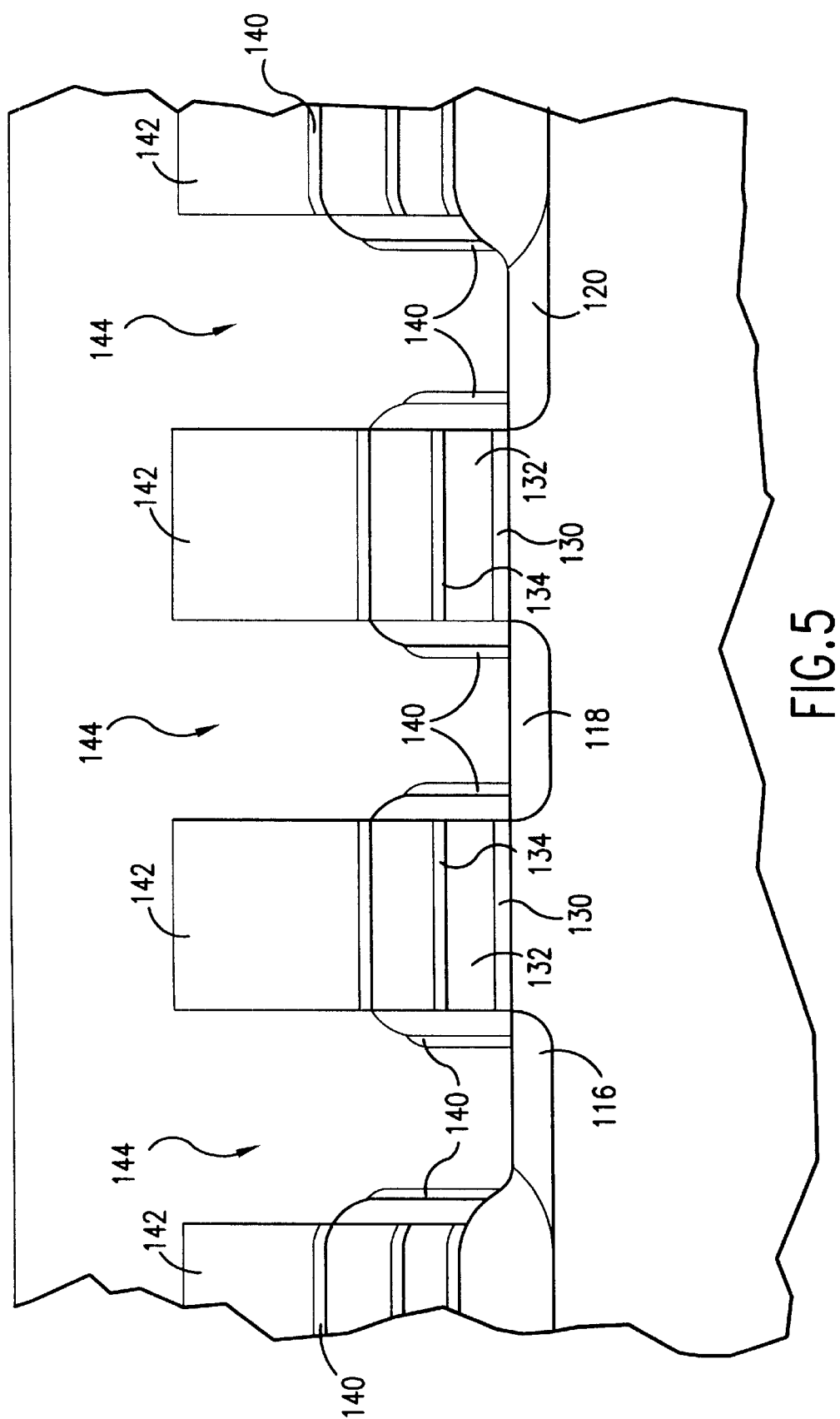
FIG. 5 is a diagrammatic cross-sectional view of a portion of a semiconductor wafer at a processing step subsequent to that shown in FIG. 4.
Figure 6:
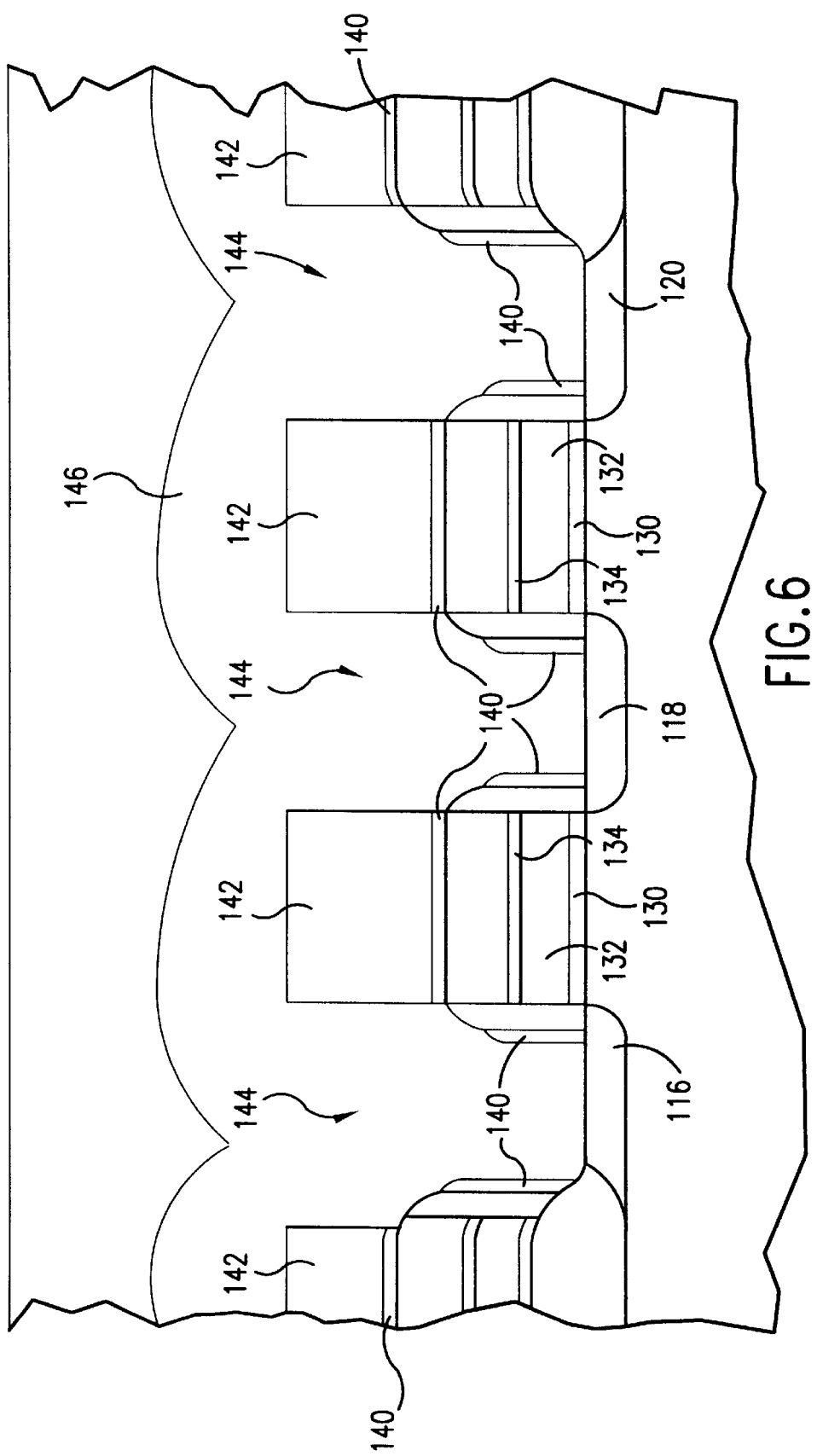
FIG. 6 is a diagrammatic cross-sectional view of a portion of a semiconductor wafer at a processing step subsequent to that shown in FIG. 5.
Figure 7:
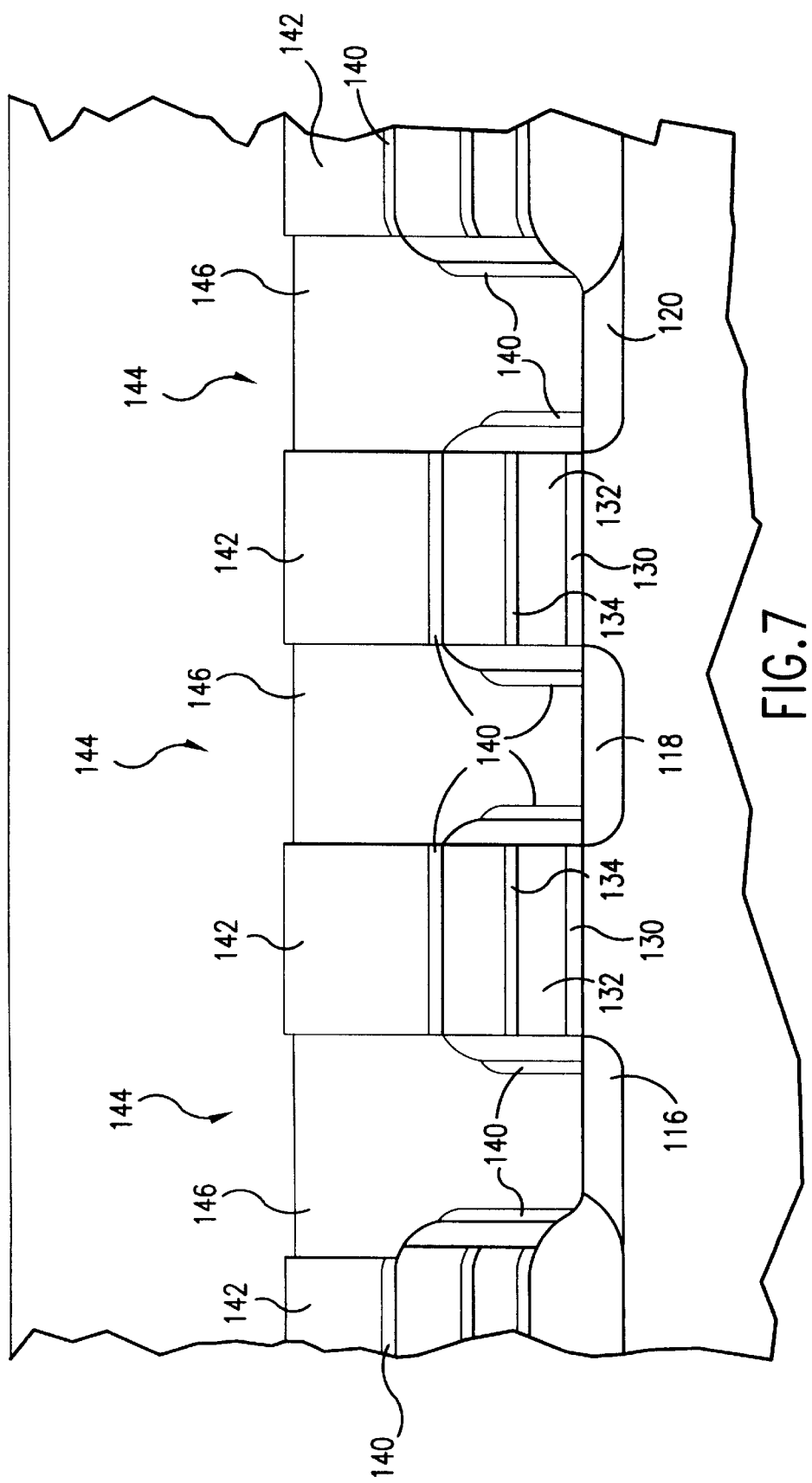
FIG. 7 is a diagrammatic cross-sectional view of a portion of a semiconductor wafer at a processing step subsequent to that shown in FIG. 6.

Referring now to FIG. 5, plug openings have been formed through the insulating layer 142. The plug openings 144 are formed through the insulating layer 142 by photomasking and dry chemical etching the BPSG relative to the thin nitride layer 140. Referring now to FIG. 6, a layer 146 of conductive material is deposited to provide conductive material within the plug openings 144. The conductive plug layer 146 is in contact with the active areas 116, 118, 120. An example of the material used to form conductive plug layer 146 is in situ arsenic or phosphorous doped poly. Referring now to FIG. 7, the conductive plug layer 146 is dry etched (or chemical-mechanical polished) to a point just below the upper surface of the BPSG layer 142 such that the remaining material of the conductive plug layer 146 forms electrically isolated plugs 146 over the active areas 116, 118, 120.

Figure 8:
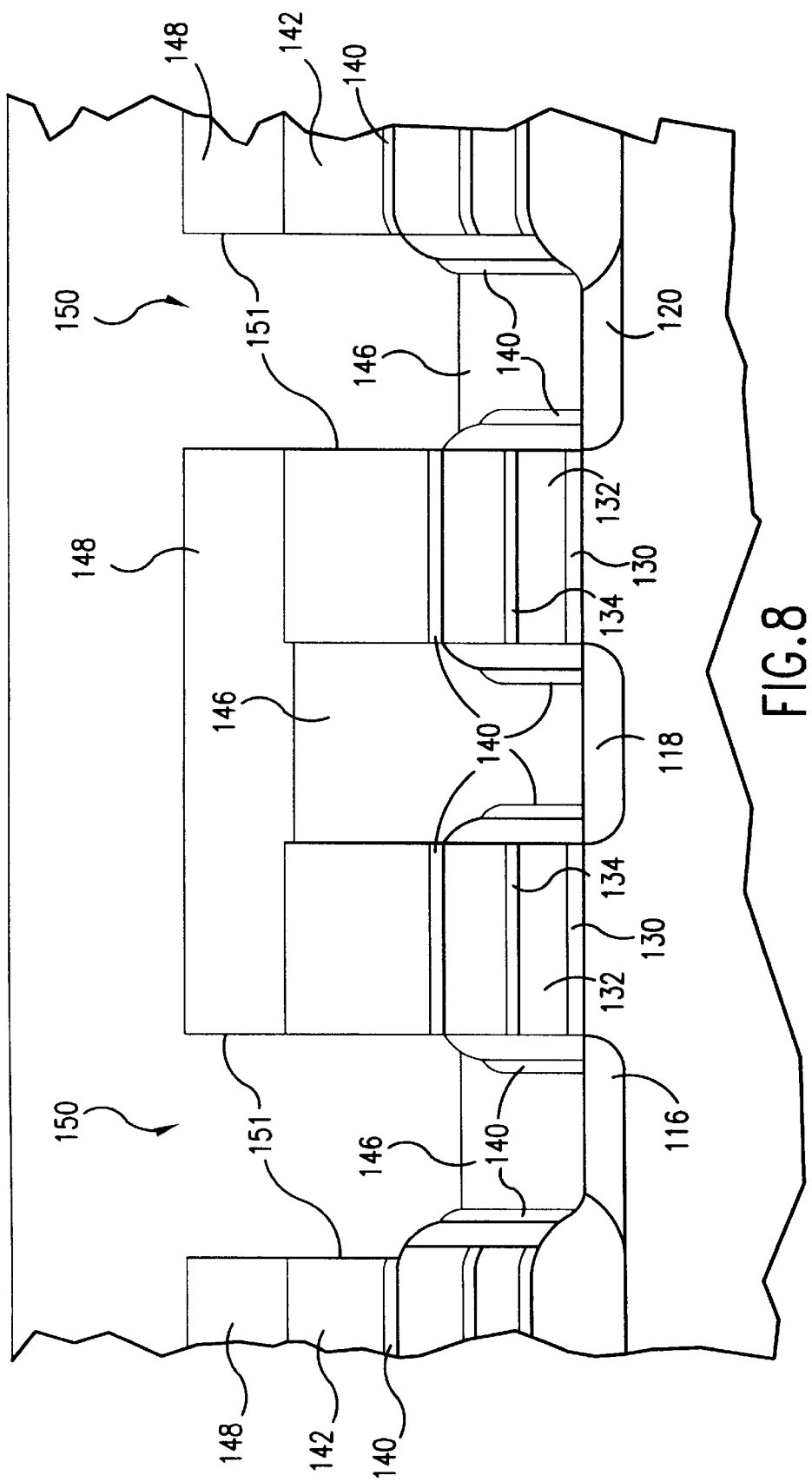
FIG. 8 is a diagrammatic cross-sectional view of a portion of a semiconductor wafer at a processing step subsequent to that shown in FIG. 7.

With reference to FIG. 8, an additional layer 148 of BPSG is then deposited on the structure. Capacitor container openings 150 having sidewalls 151 are then formed in the BPSG layer 148 by photomasking and dry chemical etching. The height of the plugs, as defined by the conductive plug layer 146 over the non-bit line active areas 116, 120 is also reduced by this step.

Figure 9:
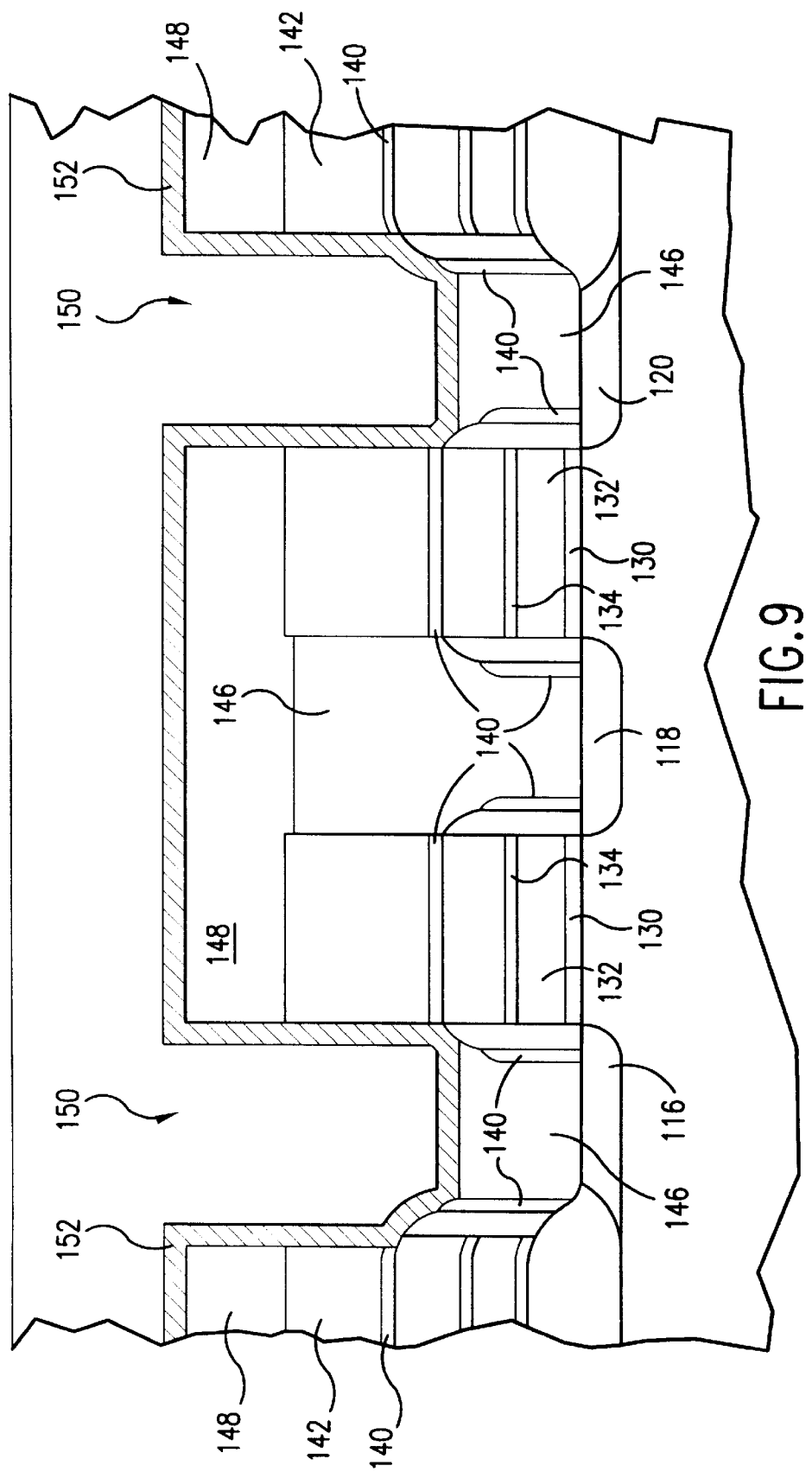
FIG. 9 is a diagrammatic cross-sectional view of a portion of a semiconductor wafer at a processing step subsequent to that shown in FIG. 8.
Figure 10:
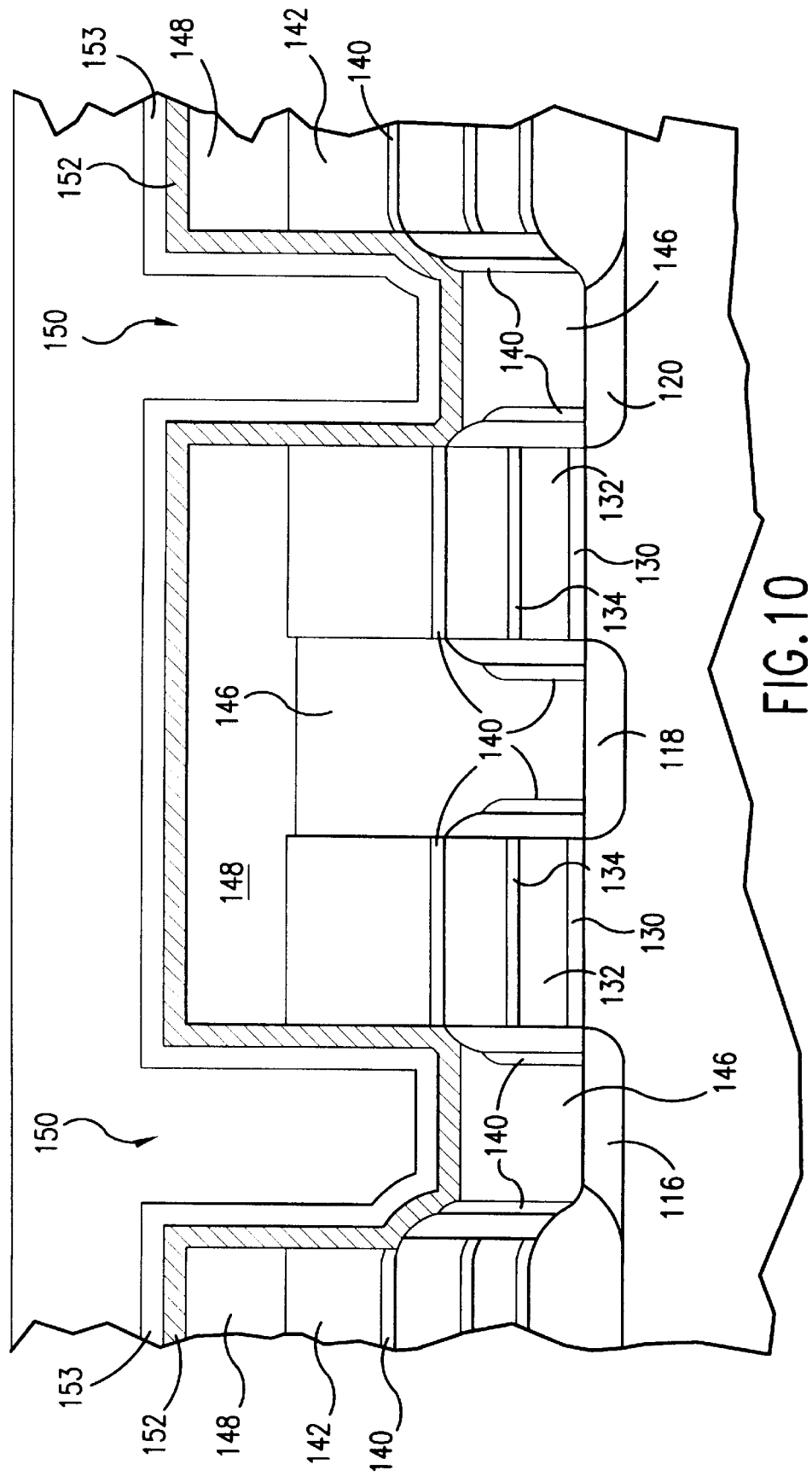
FIG. 10 is a diagrammatic cross-sectional view of a portion of a semiconductor wafer at a processing step subsequent to that shown in FIG. 9.
Figure 11:
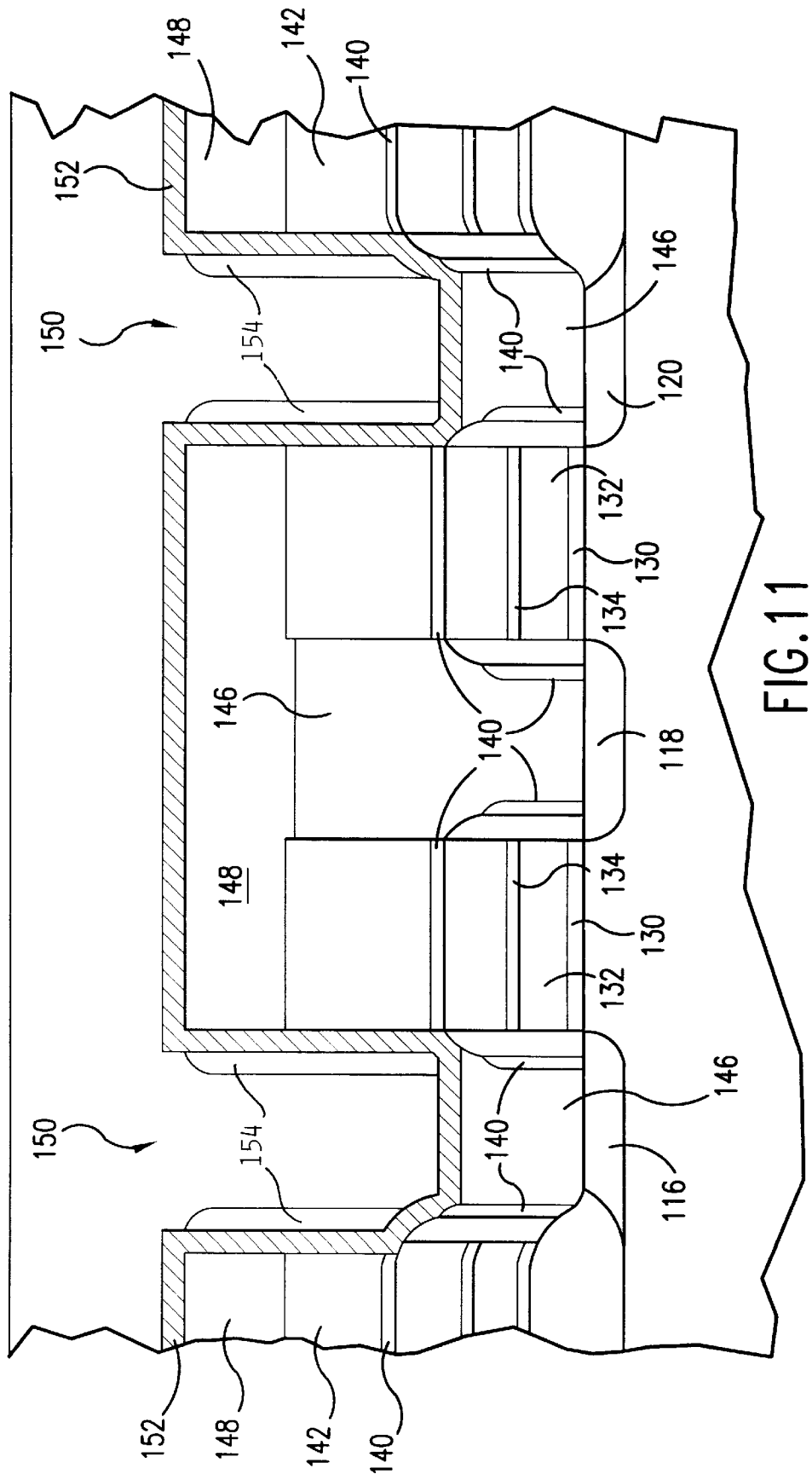
FIG. 11 is a diagrammatic cross-sectional view of a portion of a semiconductor wafer at a processing step subsequent to that shown in FIG. 10.

Referring now to FIG. 9, a conformal sacrificial layer 152 of, for example, doped poly is deposited to cover the container sidewalls, including the exposed portions of plugs 146 and insulating layers 142 and 148. Layer 152 is typically deposited to a thickness of 200 to 2000 Angstroms, more preferably about 500 to 1000 Angstroms. With reference to FIG. 10, a thin spacer layer 153 of nitride or TEOS is then deposited over sacrificial layer 152. As shown in FIG. 11, layer 153 is then spacer etched to form cylindrical spacers 154 concentric with the container sidewalls. Layer 153 may be spacered using any anisotropic etch process, including reactive ion etching (REI) or other techniques known in the art, and may be deposited using any typical spacer material, so long as the sacrificial layer 152 may be etched selective to the material chosen for spacer 154.

Figure 1:
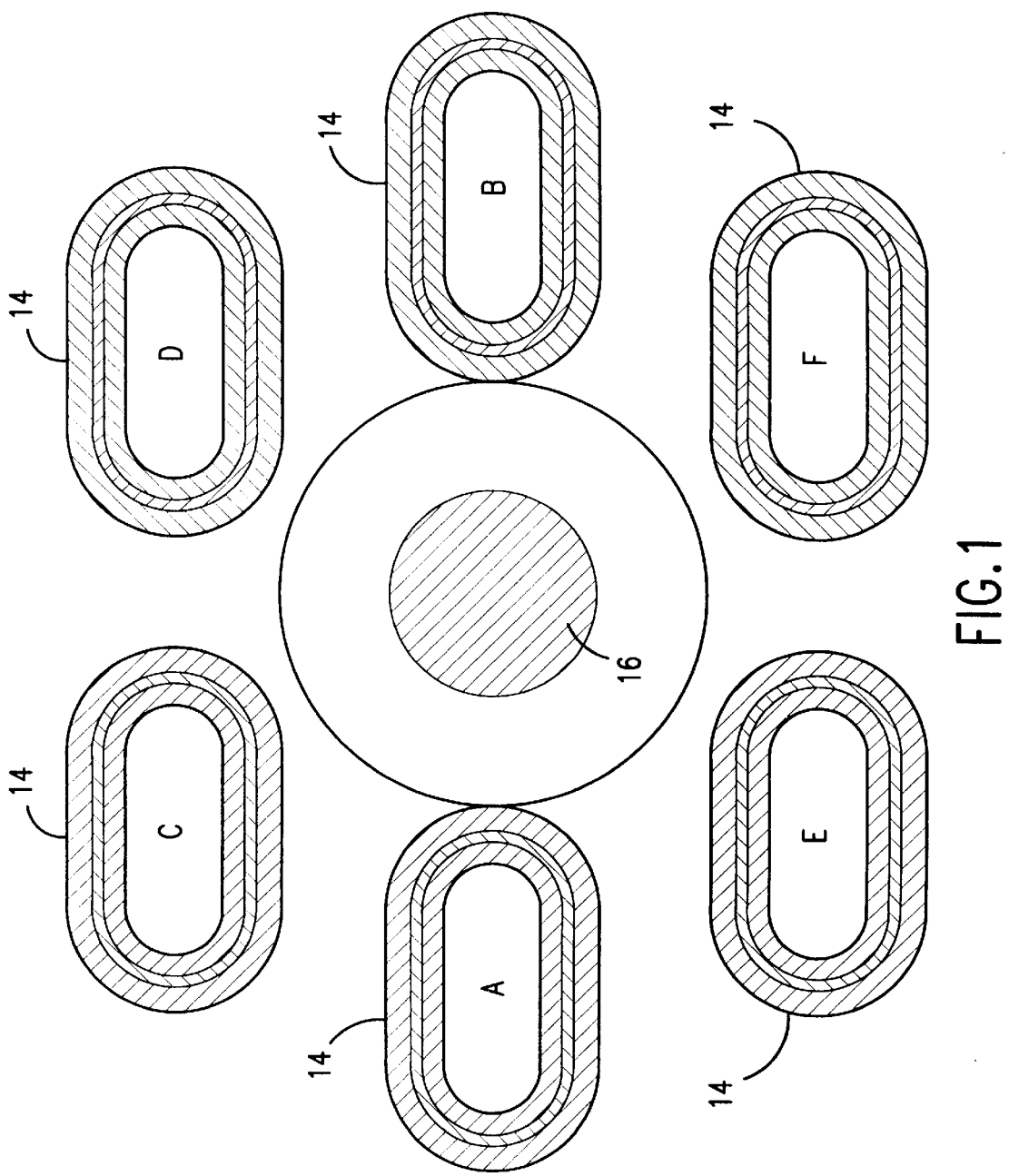
FIG. 1 is a top view of a cross section of a known memory circuit showing a number of conventionally shaped container.capacitors surrounding a bit line contact.
Figure 2B:
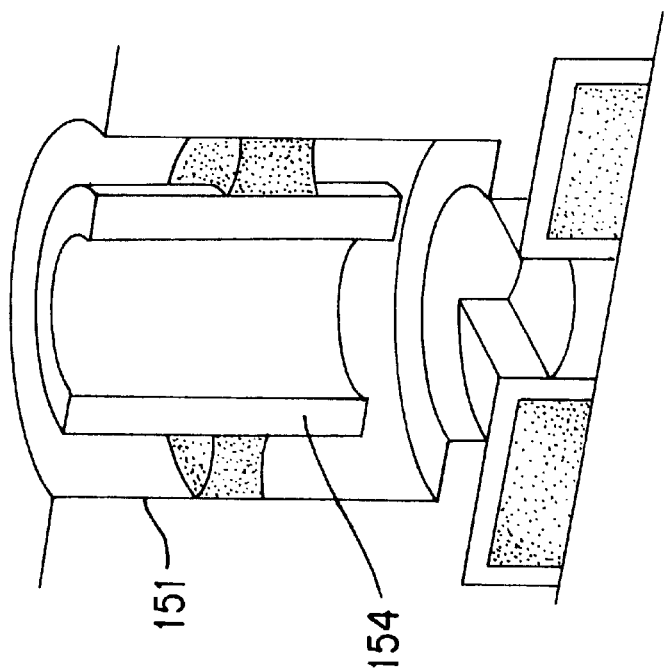
FIG. 2B is a partial three dimensional view of one embodiment of a memory circuit according to the present invention showing the finned container capacitor of FIG. 12 below.
Figure 12:
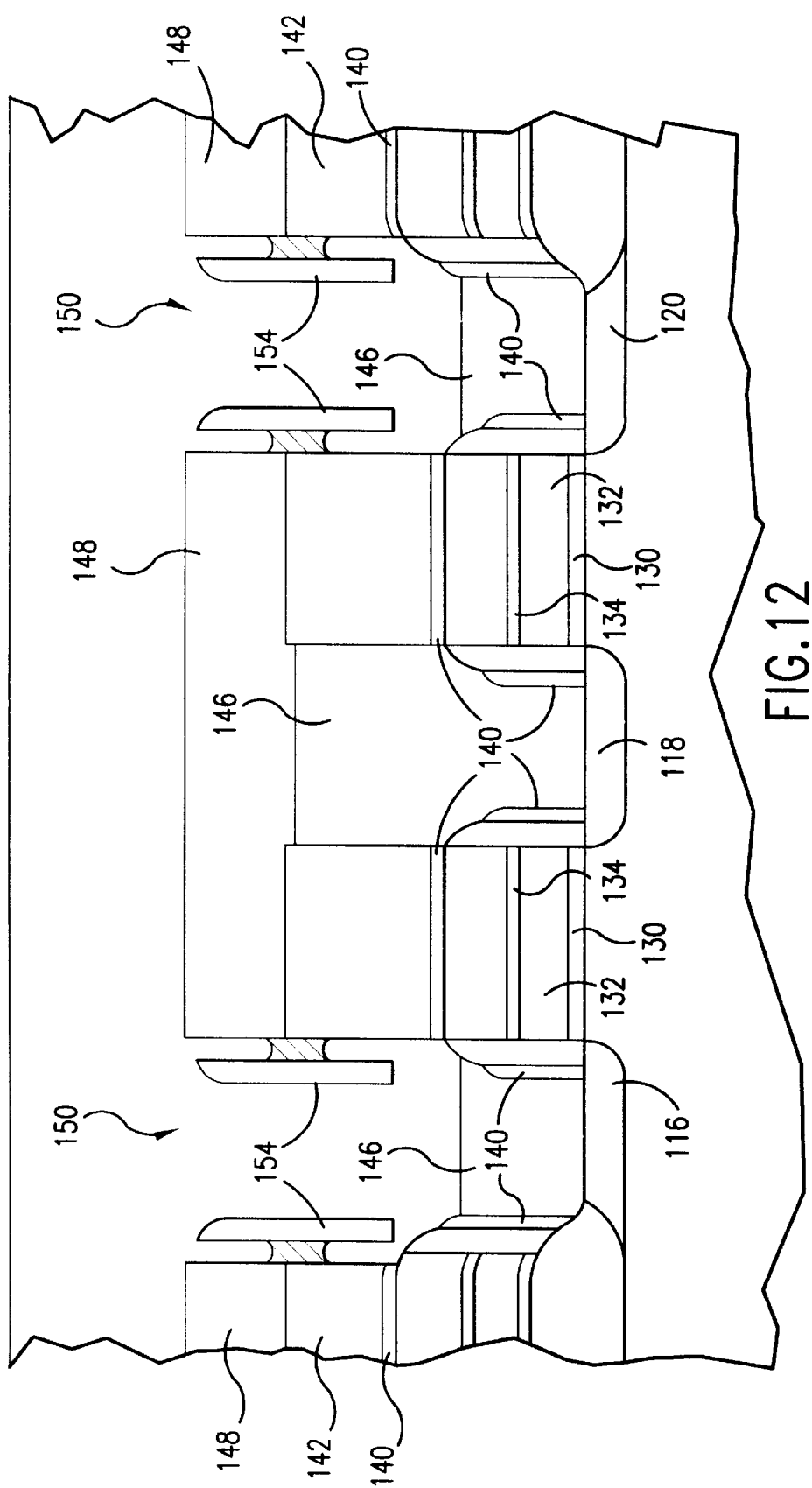
FIG. 12 is a diagrammatic cross-sectional view of a portion of a semiconductor wafer at a processing step subsequent to that shown in FIG. 11.

A portion of sacrificial layer 152 is then removed, resulting in the structure shown in FIG. 12 and in FIG. 2B. This removal is preferably performed by a wet etch process using tetramethyl ammonium hydroxide (TMAH). TMAH has a very slow $SiO_2$ etch rate relative to the rate it etches silicon (i.e., TEOS). Other etchants may also be used as long as they are capable of etching sacrificial layer 152 selective to the material of spacer 154. The etch of layer 152 is preferably timed to etch for a certain duration depending on the thickness of layer 152, such that layer 152 is not completely removed from between container sidewall 151 and the outside surface of spacer 154 which would otherwise allow spacer 154 to float away. A typical duration for the TMAH wet etch for a 500 Angstrom thickness of sacrificial layer 152 of poly is in the range of about 2 to 5 min. The etch duration and thicknesses of layer 152 and spacer 154 may be readily selected and optimized by those in the art given the teachings herein and the characteristics of the materials chosen for the etchant, sacrificial layer 152 and spacer 154. The etchant may also remove a portion of plugs 146. Preferably, at least a portion of plugs 146 will remain in place in order to guard against the occurrence of junction damage.

Figure 13:
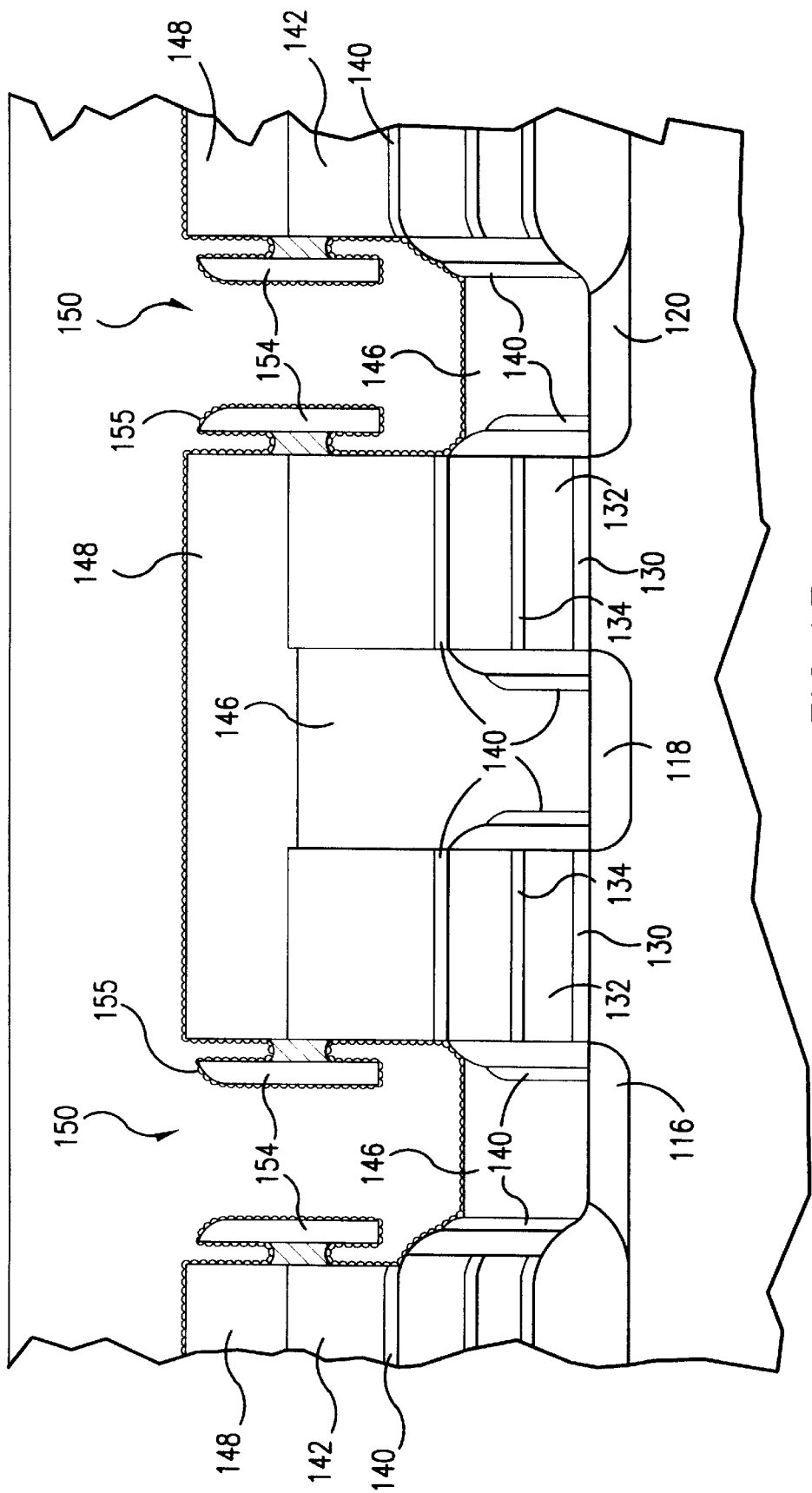
FIG. 13 is a diagrammatic cross-sectional view of a portion of a semiconductor wafer at a processing step subsequent to that shown in FIG. 12.

Referring to FIG. 13, a capacitance layer 155 is next deposited over the remaining sacrificial layer 152 and spacers 154. The capacitance layer 155 is also in electrical contact with the previously formed plugs 146 over the non-bit line active areas 116, 120. The capacitance layer 155 may be formed of any conductive material, preferably HSG (hemispherical grained poly), silica, silicon, germanium or an alloy of silica or germanium, to increase capacitance. Most preferably, the capacitance layer 155 is formed of HSG. If HSG is used, capacitance layer 155 may be formed by first depositing a layer of in situ doped polysilicon followed by a deposition of undoped HSG. Subsequent heating inherent in wafer processing will effectively conductively dope the overlying HSG layer. Alternatively, the capacitance layer 155 may be provided by in situ arsenic doping of an entire HSG layer.

Figure 14:
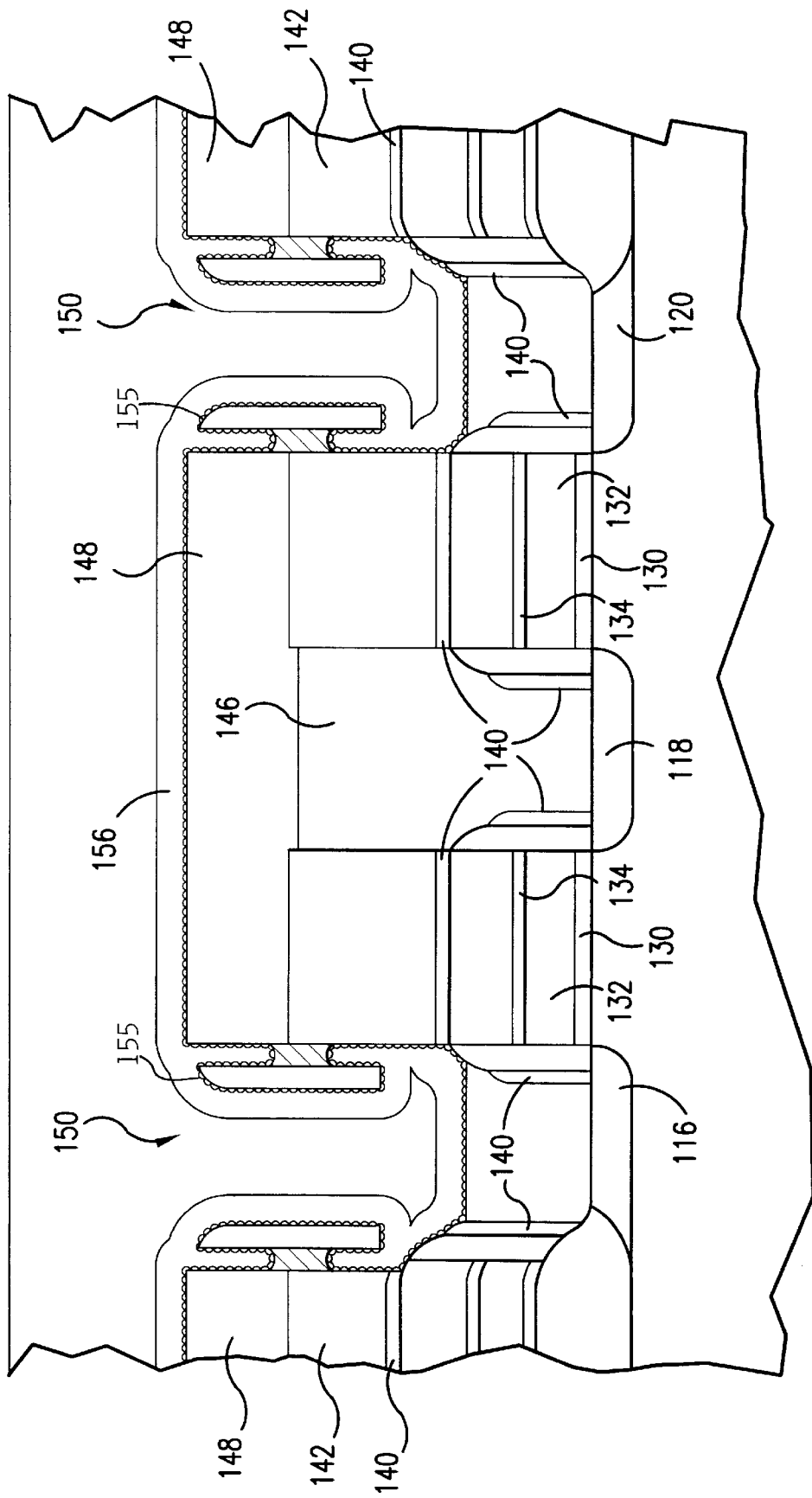
FIG. 14 is a diagrammatic cross-sectional view of a portion of a semiconductor wafer at a processing step subsequent to that shown in FIG. 13.

Referring now to FIG. 14, the portion of the capacitance layer 155 above the top of the second BPSG layer 148 is removed through a CMP or etching process, thereby electrically isolating the portions of the capacitance layer 155 remaining in the capacitor openings 150.

Referring still to FIG. 14, a dielectric film layer 156 is formed over the surface of capacitance layer 155. The preferred dielectric films have a high dielectric constant, including, for example, cell dielectrics such as $Ta_2O_5$, $SrTiO_3$ ("ST"), (Ba, Sr)$TiO_3$ ("BST"), Pb(Z,Ti)$O_3$ ("PZT"), $SrBi_2Ta_2O_9$ ("SBT") and Ba(Zr,Ti)$O_3$ ("BZT"). The dielectric film layer 156 will typically have a thickness of from about 10 to about 50 Angstroms. Layer 156 may be deposited, for example, by a low-pressure CVD process using Ta(OC$_2$H$_5$)$_5$ and O$_2$ at about 430° C., and may be subsequently annealed to minimize leakage current characteristics.

Figure 15:
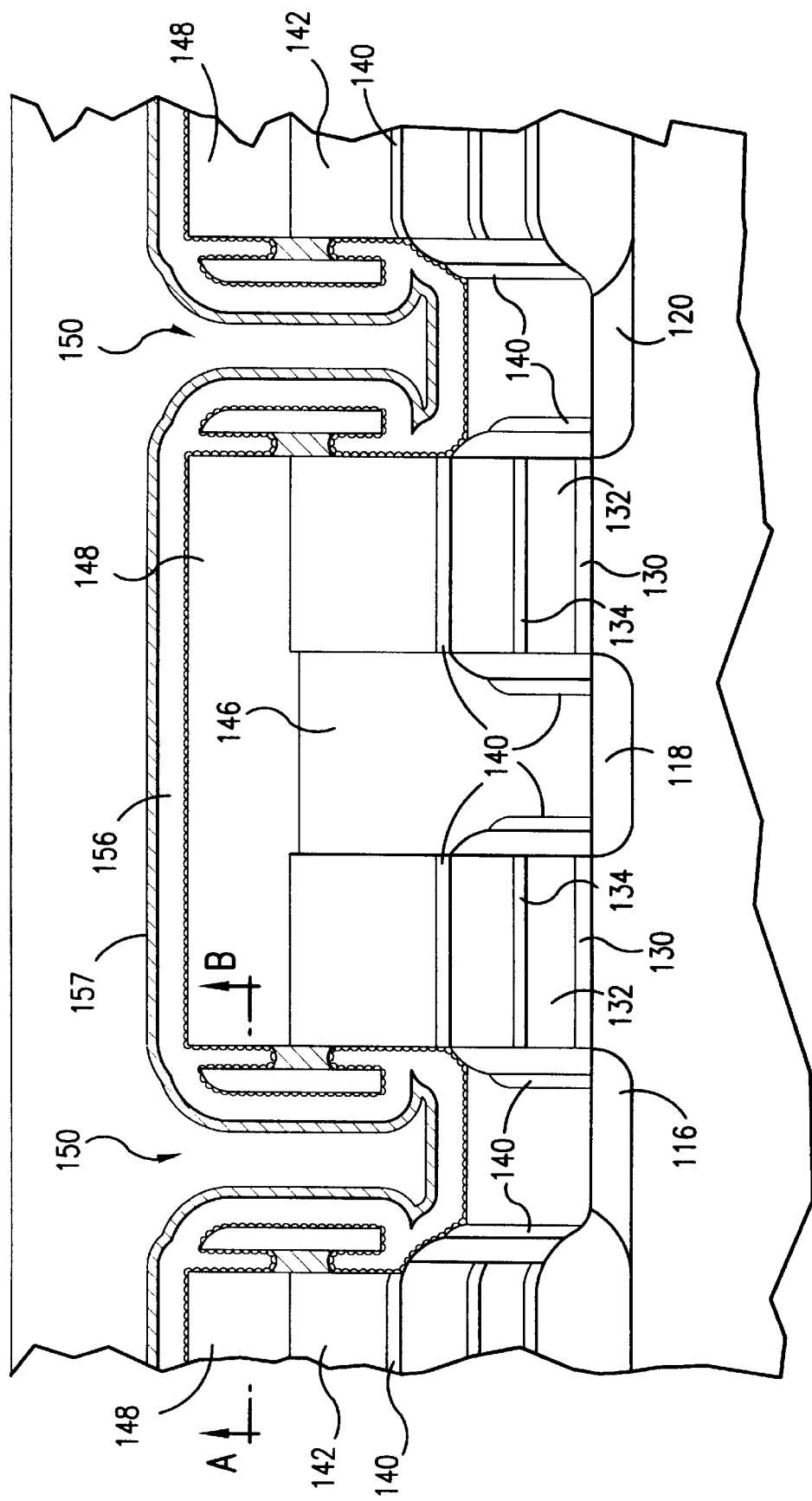
FIG. 15 is a diagrammatic cross-sectional view of a portion of a semiconductor wafer at a processing step subsequent to that shown in FIG. 14.

Referring now to FIG. 15, a conductive layer 157 is deposited to form the top electrode over the dielectric layer 156, again at a thickness which less than completely fills the capacitor opening 150. The only requirement for the selection of the conductive layer 157 is that the material is conductive. Non-limiting examples of materials that may be used to form the conductive layer 157 are $RuO_2$, Ir, $IrO_2$, Ta, Rh, $RhO_x$, $VO_3$, and alloys, such as Pt—Ru or Pt—Rh. The conductive layer 157 may be deposited by CVD, LPCVD, PECVD, MOCVD, sputtering or other suitable deposition techniques. Preferably the conductive layer 157 has a thickness of about 100 to about 1000 Angstroms, more preferably less than 500 Angstroms. In addition to serving as the second plate or corresponding electrode of the capacitor, the conductive layer 157 also forms the interconnection lines between the second plates of the capacitors. The second plate of the capacitor is connected to the reference voltage.

Figure 16:
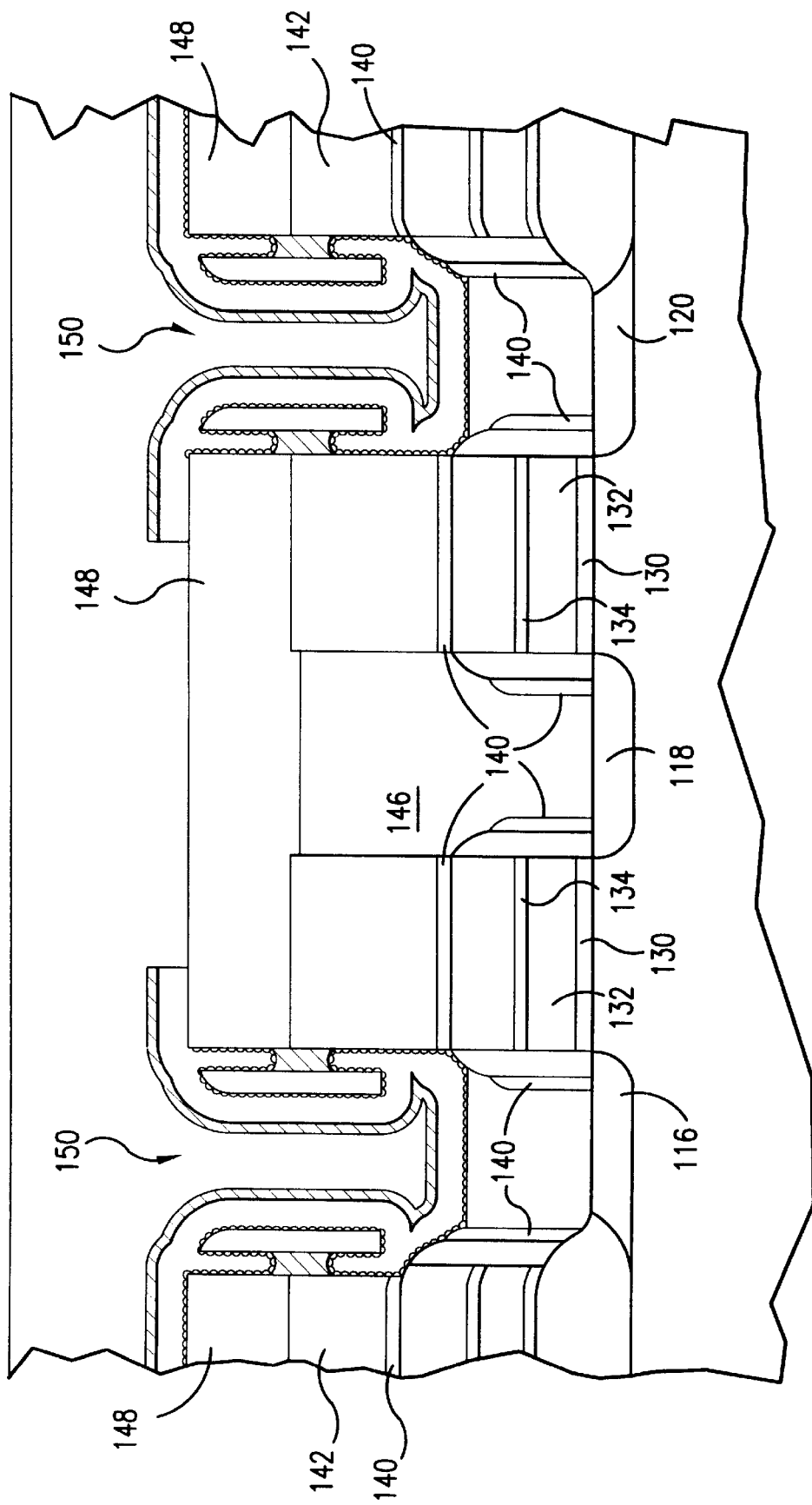
FIG. 16 is a diagrammatic cross-sectional view of a portion of a semiconductor wafer at a processing step subsequent to that shown in FIG. 15.
Figure 17:
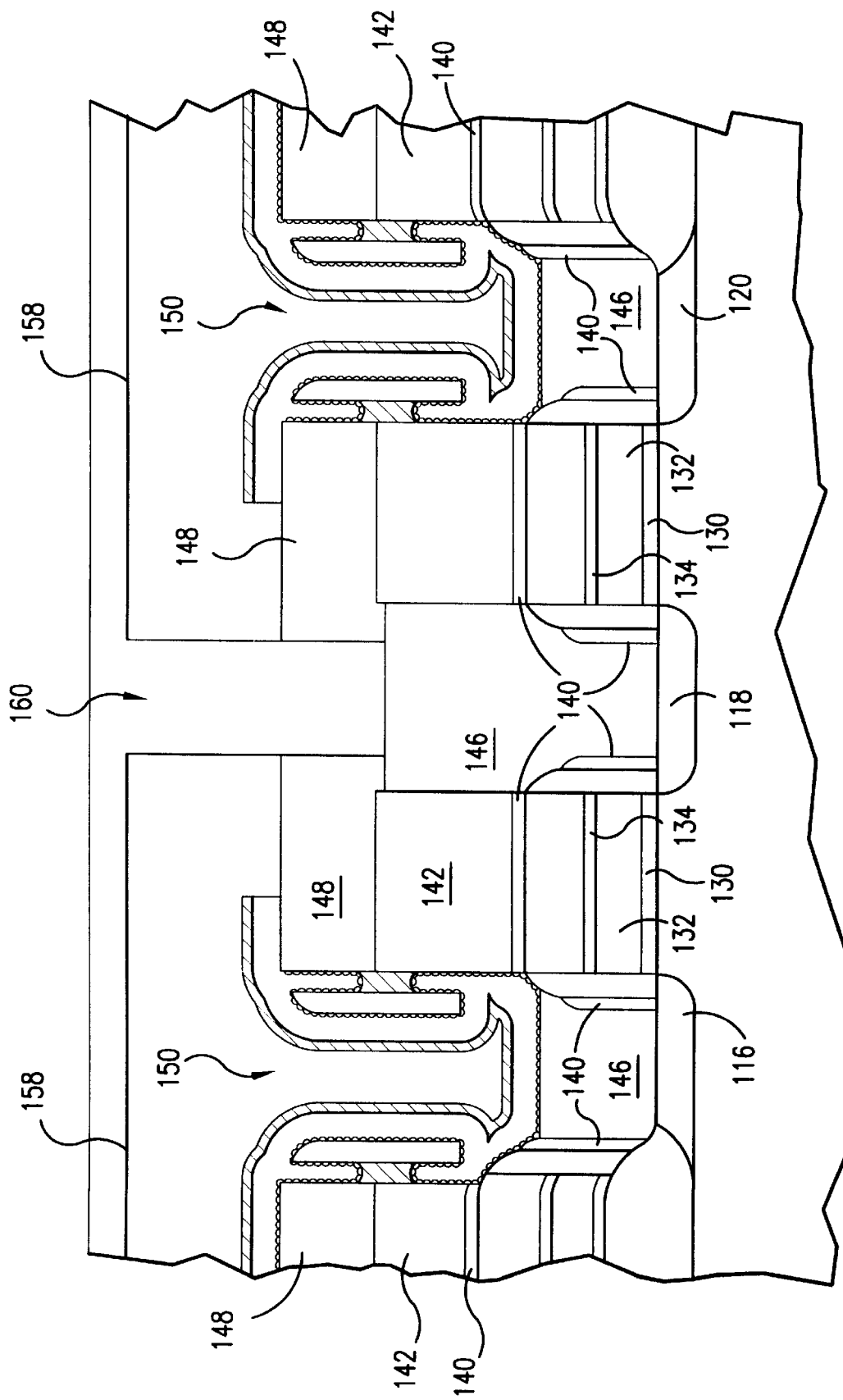
FIG. 17 is a diagrammatic cross-sectional view of a portion of a semiconductor wafer at a processing step subsequent to that shown in FIG. 16.

Referring now to FIG. 16, the conductive layer 157 and underlying capacitor dielectric layer are patterned and etched to remove portions of the dielectric layer 156 and conductive layer 157 where the bitline contact will subsequently be formed. Referring now to FIG. 17, a bit line insulating layer 158 is provided over the conductive layer 157 and the second BPSG layer 148. The bit line insulating layer 158 may be comprised of BPSG, PSG, flowable glass, spun glass or other insulative material. Preferably the bit line insulating layer 158 is BPSG. A bit line contact opening 160 is patterned through the bit line insulating layer 158 such that the conductive plug layer 146 is once again outwardly exposed. Then a bit line contact is provided in the bit line contact opening 160 such that the bit line contact is in electrical contact with the outwardly exposed portion of the plug 146. Thus, the outwardly exposed portion of the plug 146 over the active area 118 common to both FETs acts as a bit line contact.

Figure 18:
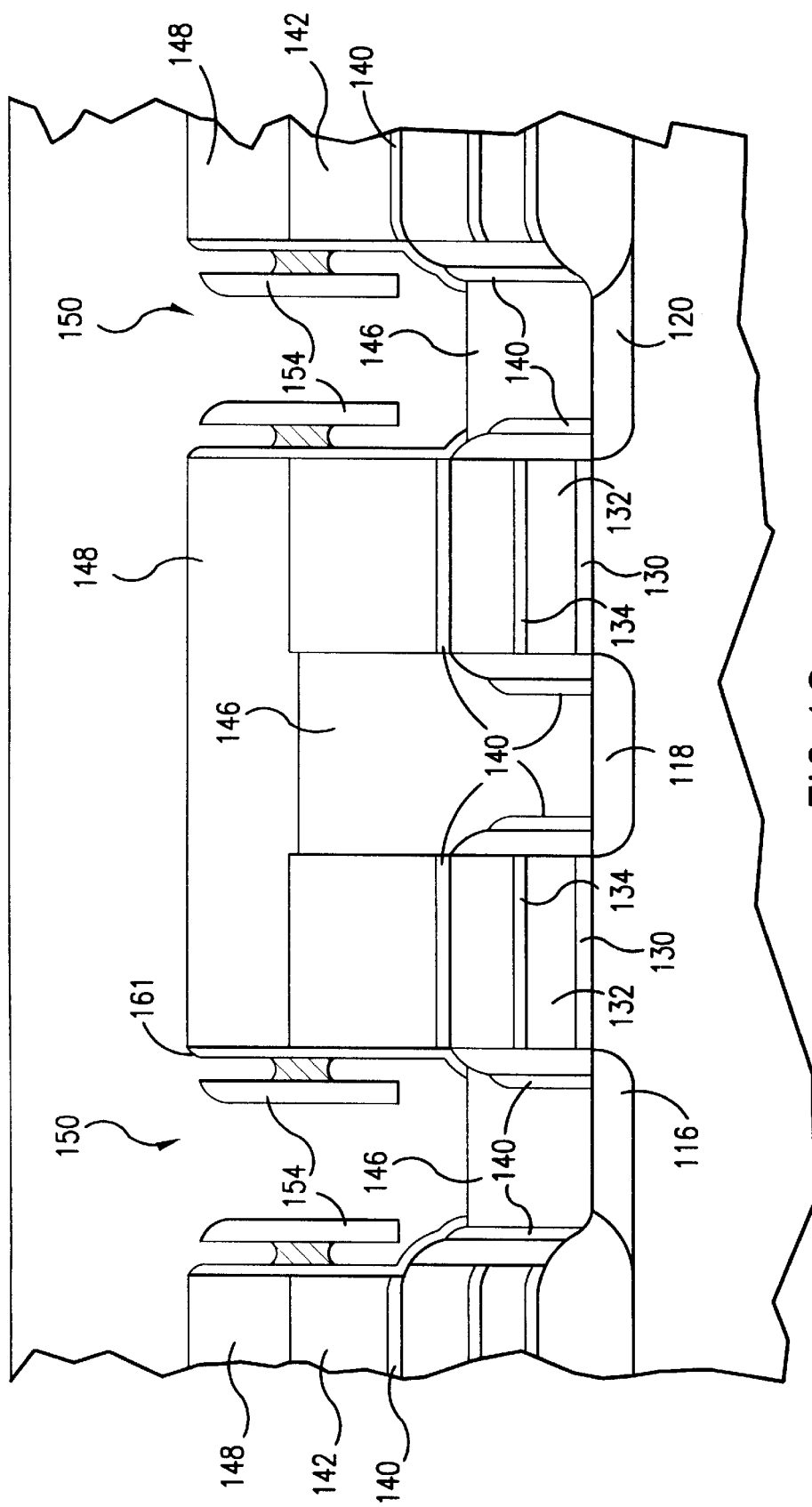
FIG. 18 is a diagrammatic cross-sectional view of a portion of a semiconductor wafer of another embodiment of the invention just prior to the processing step shown in FIG. 13.

A further preferred embodiment of the fabrication process of the invention begins at FIG. 8 after conductive layer 146 is provided in plug openings 144 and etched back to form conductive plugs in contact with active areas 116, 120. Before depositing sacrificial layer 152 a thin protective layer 161 of TEOS or other protective material is deposited to protect the conductive plugs 146 during the subsequent wet etch processing. The protective TEOS layer 161 is then removed from the bottom of the container opening to expose the surface of the plug 146 prior to deposition of the capacitance layer 155. The thin TEOS layer 161 may remain on the container sidewall 151. The resulting structure, prior to deposition of the capacitance layer 155, is then as shown in FIG. 18.

Figure 19:
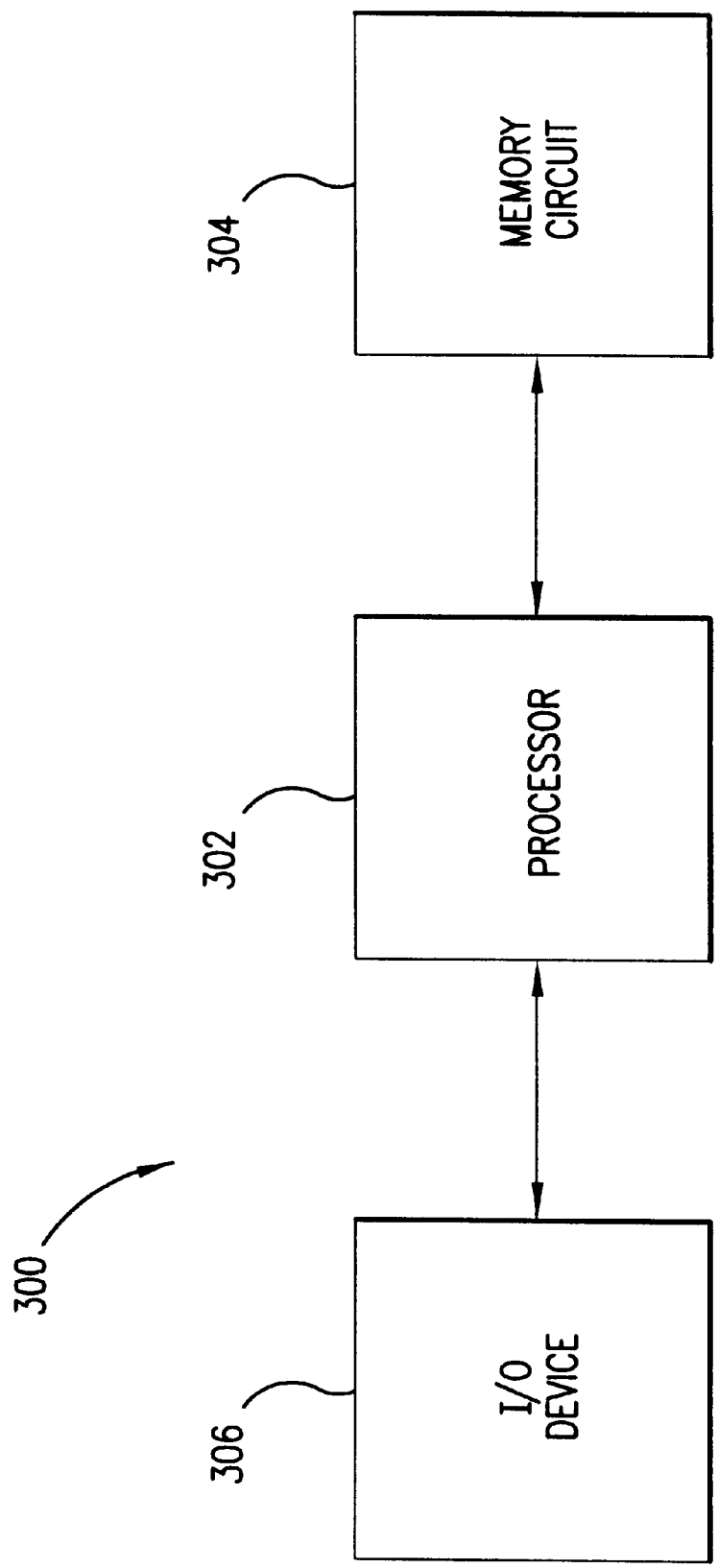
FIG. 19 is a schematic flow chart of a computer system.

FIG. 19 illustrates a computer system 300 according to one embodiment of the present invention. The computer system 300 comprises a CPU (central processing unit) 302, a memory circuit 304, and an I/O (input/output) device 306. The memory circuit 304 contains a DRAM memory circuit including the finned capacitors according to the present invention. Memory other than DRAM may be used. Also, the CPU itself may be an integrated processor which utilizes integrated capacitors according to the present invention.

Figure 2A:
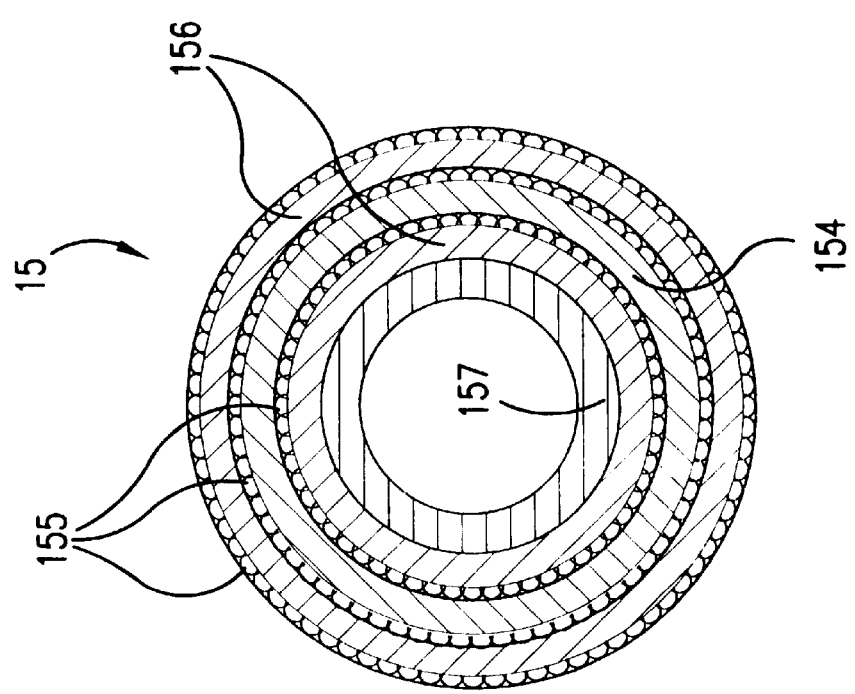
FIG. 2A is top view of a partially cut away cross section of one embodiment of a memory circuit according to the present invention showing the finned container capacitor of FIG. 15 below.

The advantages of the capacitors in accordance with the present invention will now be discussed in further detail with reference to FIGS. 2A and 2B. As noted, FIG. 2A shows a top view of a capacitor according to the invention from which the upper layers have been removed to reveal the finned container capacitor 15. Capacitor 15 has a concentric internal fin as a result of the form of spacer 154, both sides of which are coated with a capacitance materia 155 which is in electrical contact with the plug 146, as also shown in FIG. 14. In addition, capacitance layer 155 also covers the exposed portion of the container sidewall 151. Thus, the capacitance layer 155 has three discrete layers in cross-section, all within the area of the container cell. Furthermore, atop the capacitance layer 155 on both the inside and outside of the spacer fin 154 are dielectric film layers formed of dielectric layer 156. Preferably, dielectric layer 156 is comprised of a high dielectric constant material such as $Ta_2O_5$, and capacitance layer 155 is comprised of HSG.

The result of such a structure is that the effective storage capacity of capacitor 15 will be high due to the triple capacitance layer (HSG) 155 on the inside and outside of the capacitor fin, and the dual layered dielectric layer 156, again on the inside and outside of the fin (spacer 154). Thus, the capacitance per area is increased due to the increased surface area of the capacitor and the fabrication of the capacitor as described above. The present invention therefore provides an increased effective capacitance and a high capacitance per cell without increasing the size of the cell or capacitor, enabling an increased efficiency for the cell without a corresponding increase in size or additional complex fabrication steps.

It should again be noted that although the invention has been described with specific reference to DRAM memory circuits and stacked container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A finned capacitor formed within a container having a sidewall and bottom, comprising:

a first material layer within the container and covering at least a portion of the container sidewall;

a second material layer in the form of a cylinder concentric with said container sidewall, said second material layer being in contact with said first material layer and said first material layer being disposed between the sidewall and second material layer;

a first layer of conductive material on both sides of the concentric cylinder and on at least a portion of the container sidewall; and a layer of dielectric material on the layer of first conductive material.

2. The capacitor of claim 1 further comprising a second layer of conductive material on said dielectric layer.

3. The capacitor of claim 1 wherein the first material layer is in the form of an annular ring concentric with the container sidewall.

4. The capacitor of claim 3 wherein the annular ring has a height (H) in a direction parallel to the sidewall, the concentric cylinder of second material extending a distance parallel to the sidewall which distance is greater than (H).

5. The capacitor of claim 3 wherein the first layer of conductive material covers at least a portion of the annular ring of the first material layer.

6. The capacitor of claim 1 wherein the dielectric material layer contacts the first conductive material between the sidewall and the cylinder of the second material layer.

7. The capacitor of claim 1, wherein said first conductive material layer is selected from the group consisting of hemispherical grained polysilicon, silica, silicon, germanium, and alloys of silica or germanium.

8. The capacitor of claim 1, wherein said first conductive material layer is hemispherical grained polysilicon.

9. A capacitor comprising:
a container having a sidewall and bottom;
a first annular ring layer within said container and covering a portion of the container sidewall, and having a height extending in a direction parallel to said sidewall;
a second cylindrical layer concentric with said first annular ring layer and extending in a direction parallel to the container sidewall a distance greater than the height of the first annular ring;
a first layer of conductive material on at least portions of both sides of said second cylindrical layer, at least a portion of said first annular ring, and at least portions of said container sidewall and bottom;
a layer of dielectric material on said layer of first conductive material, including said first conductive material on both sides of the second cylindrical layer; and
a second conductive layer, said dielectric layer being disposed between said first conductive layer and said second conductive layer.

10. The capacitor of claim 9, wherein said first conductive layer is selected from the group consisting of hemispherical grained polysilicon, silica, silicon, germanium, and alloys of silica or germanium.

11. The capacitor of claim 9, wherein said first conductive material layer comprises hemispherical grained polysilicon.

12. The capacitor of claim 9, wherein said second conductive material is formed of a metal, wherein an oxide of said metal is conductive.

13. The capacitor of claim 9, wherein said second conductive material layer is selected from the group consisting of Ru, $RuO_2$, Ir, $IrO_2$, Ta, Rh, $RhO_x$ $VO_3$, a Pt—Ru alloy and a Pt—Rh alloy.

14. The capacitor of claim 9, wherein said dielectric layer is a nitride film.

15. The capacitor according to claim 9, wherein said dielectric layer is selected from the group consisting of tantalum pentoxide ($Ta_2O_5$), Strontium Titanate (ST), Barium Strontium Titanate (BST), Lead Zirconium Titanate (PZT), Strontium Bismuth Titanate (SBT) and Bismuth Zirconium Titanate (BZT).

16. The capacitor according to claim 9, wherein said capacitor is a stacked container capacitor.

17. The capacitor according to claim 9, wherein said capacitor is in a DRAM cell.

18. A computer system comprising:
a processor; and
a memory circuit connected to the processor, wherein one or more of said processor or memory circuits contain at least one container capacitor, said capacitor having
a container sidewall and bottom;
a first annular ring layer covering a portion of the container sidewall and having a height extending in a direction parallel to said sidewall;
a second annular ring layer on said first annular ring layer and extending in a direction parallel to the container sidewall a distance greater than the height of the first annular ring so that a space is formed between the second annular ring and the container sidewall;
a first layer of conductive material on at least portions of both sides of said second annular ring, at least a portion of said first annular ring and at least portions of said container sidewall and bottom;
a layer of dielectric material on said layer of first conductive material including said first conductive material between the second annular ring and the container sidewall; and
a second layer of conductive material on said dielectric layer.

19. The computer system of claim 18 wherein said memory circuit is DRAM cell.

20. The computer system of claim 18, wherein said first layer of conductive material comprises hemispherical grained polysilicon.

21. The computer system of claim 18, wherein said second conductive layer is formed of a material selected from the group consisting of Ru, $RuO_2$, Ir, $IrO_2$, Ta, Rh, $RhO_x$ $VO_3$, a Pt—Ru alloy and a Pt—Rh alloy.

22. A memory cell comprising:
a transistor; and
a capacitor, said transistor and capacitor being connected in a memory array, said capacitor including
a container having a sidewall and bottom;
a first annular ring layer covering a portion of the container sidewall and having a height extending in a direction parallel to said sidewall;
a second cylindrical layer concentric with said first annular ring layer and extending in a direction parallel to the sidewall a distance greater than the height of the first annular ring so that a space is formed between the second cylindrical layer and the container sidewall;
a first layer of conductive material on at least portions of both sides of said second cylindrical layer, a portion of said first annular ring and at least portions of said container sidewall and bottom;
a layer of dielectric material on said layer of first conductive material; and
a second layer of conductive material on said dielectric layer.

23. The memory cell of claim 22, wherein said first conductive layer is selected from the group consisting of hemispherical grained polysilicon, silica, silicon, germanium, and alloys of silica or germanium.

24. The memory cell of claim 22, wherein said first layer of conductive material comprises hemispherical grained polysilicon.

25. The memory cell of claim 22, wherein said second conductive material is formed of a metal, wherein an oxide of said metal is conductive.

26. The memory cell of claim 22, wherein said second layer of conductive material is formed of a material selected from the group consisting of Ru, $RuO_2$, Ir, $IrO_2$, Ta, Rh, $RhO_x$ $VO_3$, a Pt—Ru alloy and a Pt—Rh alloy.

27. The memory cell of claim 22, wherein said dielectric layer is a nitride film.

28. The memory cell of claim 22, wherein said dielectric layer is selected from the group consisting of tantalum pentoxide ($Ta_2O_5$), Strontium Titanate (ST), Barium Strontium Titanate (BST), Lead Zirconium Titanate (PZT), Strontium Bismuth Titanate (SBT) and Bismuth Zirconium Titanate (BZT).

29. The memory cell of claim 22, wherein said capacitor is a stacked capacitor.

30. The memory cell of claim 22, wherein said second cylindrical layer comprises a material selected from the group consisting of TEOS and nitride.

31. The memory cell of claim 22, wherein said first annular layer is comprised of doped poly.

32. The memory cell of claim 22, wherein said cell is a DRAM cell.

* * * * *

UNITED STATES PATENT AND TRADEMARK OFFICE
CERTIFICATE OF CORRECTION

PATENT NO. : 6,188,100 B1
DATED : February 13, 2001
INVENTOR(S) : Michael Hermes It is certified that error appears in the above-identified patent and that said Letters Patent is hereby corrected as shown below:

Column 4,
Line 19, reads "(REI)"; should read -- (RIE) --.

Column 6,
Line 11, reads "materia 155"; should read -- material 155 --.

Column 8,
Line 22, reads "is Dram cell" should read -- is a Dram cell --.

Signed and Sealed this

Ninth Day of April, 2002

Attest:

Attesting Officer

JAMES E. ROGAN
Director of the United States Patent and Trademark Office